(12) United States Patent
Jung et al.

(10) Patent No.: US 7,408,257 B2
(45) Date of Patent: Aug. 5, 2008

(54) PACKAGING CHIP AND PACKAGING METHOD THEREOF

(75) Inventors: Kyu-dong Jung, Suwon-si (KR); Woon-bae Kim, Suwon-si (KR); In-sang Song, Seoul (KR); Moon-chul Lee, Yongin-si (KR); Jun-sik Hwang, Yongin-si (KR); Suk-jin Ham, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 134 days.

(21) Appl. No.: 11/390,220

(22) Filed: Mar. 28, 2006

(65) Prior Publication Data

US 2006/0273444 A1    Dec. 7, 2006

(30) Foreign Application Priority Data

Jun. 3, 2005    (KR) .................. 10-2005-0047854

(51) Int. Cl.
*H01L 23/04* (2006.01)
(52) U.S. Cl. .................... 257/698; 257/704
(58) Field of Classification Search ................ 257/704, 257/698, 433, 778; 439/106, 125
See application file for complete search history.

(56) References Cited

U.S. PATENT DOCUMENTS

| | | | | |
|---|---|---|---|---|
| 5,331,203 A | * | 7/1994 | Wojnarowski et al. ...... 257/698 |
| 5,723,904 A | * | 3/1998 | Shiga ......................... 257/698 |
| 5,757,072 A | * | 5/1998 | Gorowitz et al. ............ 257/700 |
| 6,583,513 B1 | * | 6/2003 | Utagikar et al. ............. 257/778 |
| 6,777,263 B1 | * | 8/2004 | Gan et al. ................... 438/106 |
| 7,115,961 B2 | * | 10/2006 | Watkins et al. .............. 257/433 |
| 2007/0049016 A1 | * | 3/2007 | Hiatt et al. .................. 438/667 |
| 2007/0085195 A1 | * | 4/2007 | Lee et al. .................... 257/704 |

* cited by examiner

*Primary Examiner*—S. V Clark
(74) *Attorney, Agent, or Firm*—Sughrue Mion, PLLC

(57) ABSTRACT

A packaging chip in which a circuit module is packaged and a method of packaging a circuit module are provided. The packaging chip includes a base wafer; a circuit module on the base wafer; a packaging wafer having a cavity and combined with the base wafer so that the circuit module fits inside the cavity; a connecting electrode connecting upper and lower surfaces of the cavity; and a seed layer between the connecting electrode and the packaging wafer. The method includes etching a lower surface of the packaging wafer to form a cavity, stacking a metal layer in an area of the lower surface, combining the base wafer with the packaging wafer, polishing the packaging wafer, forming a viahole through the packaging wafer, stacking a seed layer on the packaging wafer, plating the inside of the viahole, removing the seed layer and forming an electrode.

13 Claims, 6 Drawing Sheets

US 7,408,257 B2

PACKAGING CHIP AND PACKAGING METHOD THEREOF

CROSS-REFERENCE TO RELATED APPLICATIONS

This application claims the benefit of Korean Patent Application No. 2005-47854 filed Jun. 3, 2005, in the Korean Intellectual Property Office, the entire disclosure of which is incorporated herein by reference.

BACKGROUND OF THE INVENTION

1. Field of the Invention

The present invention relates to a packaging chip packaged by a packaging wafer and a method of manufacturing the packaging chip, and more particularly, to a packaging chip packaged using a packaging wafer including a seed layer stacked on an inner side of a viahole and a method of manufacturing the packaging chip.

2. Description of the Related Art

Electronic packaging chips used in various electronic products include micro electronic circuits and thus may be damaged by external impacts. Thus, when such a packaging chip is manufactured, a packaging process must be performed to package the packaging chip so that the packaging chip has physical function and shape so as to endure an external impact. In particular, packaging must be performed on a wafer level to make electronic products small and high performance. In general, a packaging wafer having a predetermined shape is bonded to a wafer including a circuit module to perform the packaging on the wafer level. A packaging chip is supplied with power from an external source so as to perform a specific operation. Thus, packaging must be performed so that an external power source is connected to an internal electronic circuit.

For this purpose, there is used a method of forming a viahole penetrating a packaging wafer and then connecting an internal electronic circuit to an external power source through the viahole using wires. However, if the wires are used, minute dust may flow into the packaging chip through the viahole and signal loss may occur through the wires.

Thus, there has been developed a method of manufacturing a connecting electrode penetrating a packaging wafer to connect an internal electronic circuit to an external power source through the connecting electrode. The connecting electrode is manufactured using a method of forming a viahole penetrating the packaging wafer to stack a seed layer and then plating the viahole using the seed layer. However, a plating speed varies at each portion of the viahole, thus the viahole is not completely filled. As a result, cracks or voids may slightly occur in the viahole. If voids occur, impurities inside the voids rust, which may break down the packaging chip. The impurities inside the voids may be heated by a current supplied from an external source and thus damaged. If cracks occur, minute dust flows into an element from the outside, and thus the element may malfunction.

To prevent these problems, there has been developed a method of forming a seed layer only inside a viahole and plating an inside of the viahole using the seed layer to manufacture a connecting electrode. However, the seed layer is formed only at a low portion, and a plating speed becomes slow. This increases cost. As a result, the unit cost of a packaging chip is increased. Also, cracks may occur, or the packaging chip may be damaged due to a low adhesive strength between a packaging wafer and the connecting electrode. Thus, the manufacturing yield of packaging chips is decreased.

SUMMARY OF THE INVENTION

An aspect of the present general inventive concept is to provide a packaging chip in which a viahole formed in a packaging wafer is plated with a seed layer stacked on an inner side of the viahole to prevent voids or cracks from occurring during the plating and to improve a plating speed so as to reduce packaging time and cost and a method of manufacturing the packaging chip.

According to an aspect of the present invention, there is provided a packaging chip including a base wafer; a circuit module formed in an area of an upper surface of the base wafer; a packaging wafer including a lower surface including an area including a cavity and combined with the base wafer so that the circuit module is positioned inside the cavity; a connecting electrode connecting upper and lower surfaces of the area of the packaging wafer in which the cavity is formed; and a seed layer positioned between the connecting electrode and the packaging wafer.

The packaging chip may further include a metal layer stacked in an area of the lower surface of the packaging wafer; under bump metallurgy (UBM) layer stacked in an area of the metal layer; a bonding layer stacked in an area of an upper surface of the base wafer to be bonded to the UBM layer so as to combine the packaging wafer with the base wafer; and a bump connecting the UBM layer to the circuit module.

According to another aspect of the present invention, there is provided a method of packaging a circuit module formed on a base wafer using a packaging wafer, including etching a lower surface of the packaging wafer to form a cavity and stacking a metal layer in an area of the lower surface of the packaging wafer; combining the base wafer comprising an upper surface including an area in which the circuit module is formed with the packaging wafer; polishing the upper surface of the packaging wafer; forming at least one viahole penetrating the packaging wafer so as to be connected to the metal layer; stacking a seed layer on a portion of the metal layer exposed toward the upper surface of the packaging wafer through the at least one viahole, an inner side of the at least one viahole, and the upper surface of the packaging wafer; plating an inside of the at least one viahole using the seed layer to form at least one connecting electrode; and removing the seed layer stacked on the upper surface of the packaging wafer and forming an electrode connected to the at least one connecting electrode.

The at least one viahole may be formed inside the cavity.

The combining of the base wafer may include stacking and patterning a UBM layer on the metal layer stacked on the lower surface of the packaging wafer; stacking a bonding layer in an area of the upper surface of the base wafer; and bonding the UBM layer to the bonding layer.

According to still another aspect of the present invention, there is provided a packaging chip including a glass wafer; a bonding layer stacked in an area of a lower surface of the glass wafer; a packaging wafer including an upper surface including an area in which a metal layer is stacked and combined with the base wafer due to bonding of the metal layer to the bonding layer; an image sensor module formed in an area of the upper surface of the packaging wafer and positioned inside a cavity formed between the lower surface of the glass wafer and the upper surface of the packaging wafer; at least one connecting electrode connecting the metal layer stacked on the upper surface of the packaging wafer to a lower surface of the packaging wafer; and a seed layer positioned between the at least one connecting electrode and the packaging wafer.

The packaging chip may further include a coating layer formed on an upper surface of the glass wafer; and an electrode formed on the lower surface of the packaging wafer so as to be connected to the at least one connecting electrode.

The packaging chip may further include at least one substrate which is sequentially stacked on the lower surface of the packaging wafer and on which a circuit module is mounted.

According to yet another aspect of the present invention, there is provided a method of packaging an image sensor, including stacking a bonding layer in area on a lower surface of a glass wafer; mounting an image sensor module on an upper surface of a packaging wafer; stacking a metal layer in an area of the upper surface of the packaging wafer; bonding the metal layer to the bonding layer to combine the packaging wafer with the glass wafer so that the image sensor module is positioned inside a cavity formed between the lower surface of the glass wafer and the upper surface of the packaging wafer; polishing a lower surface of the packaging wafer; forming at least one viahole penetrating the packaging wafer to be connected to the metal layer; stacking a seed layer on a portion of the metal layer exposed toward the lower surface of the packaging wafer through the at least one viahole, an inner side of the at least one viahole, and the lower surface of the packaging wafer; and plating an inside of the at least one viahole using the seed layer to form at least one connecting electrode.

The method may further include removing the seed layer stacked on the lower surface of the packaging wafer and forming an electrode connected to the at least one connecting electrode.

The method may further include forming a coating layer on an upper surface of the glass wafer.

The method may further include sequentially stacking at least one substrate on which a circuit module is mounted, on the lower surface of the packaging wafer.

BRIEF DESCRIPTION OF THE DRAWINGS

The above and other aspects of the present invention will be more apparent by describing certain exemplary embodiments of the present invention with reference to the accompanying drawings, in which.

DETAILED DESCRIPTION OF EXEMPLARY EMBODIMENTS OF THE INVENTION

Figure 1:
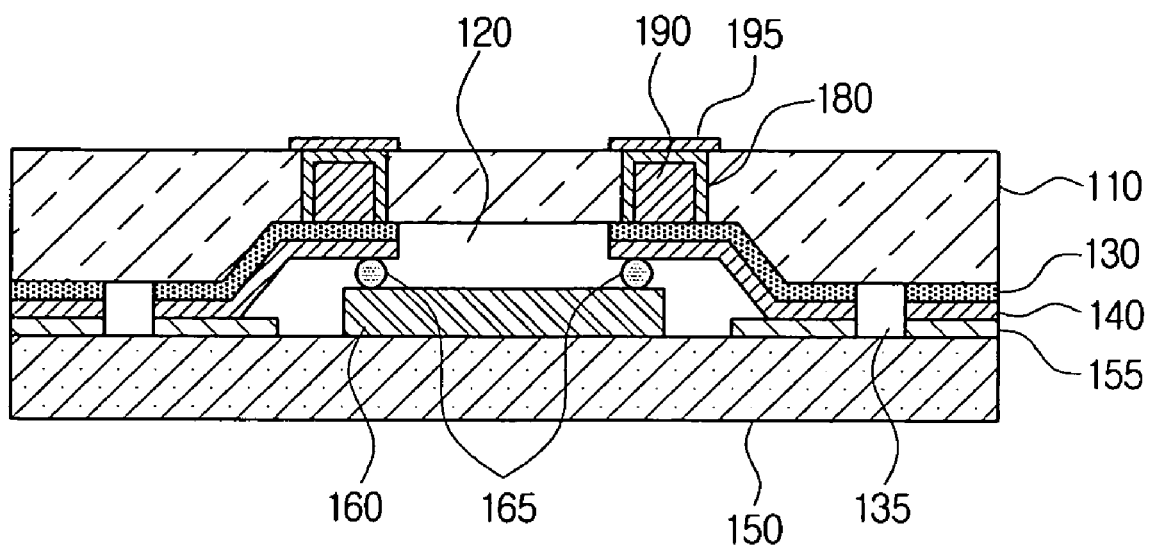
FIG. 1 is a cross-sectional view of a packaging chip according to an exemplary embodiment of the present invention.

Certain exemplary embodiments of the present invention will be described in greater detail with reference to the accompanying drawings.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

FIG. 1 is a cross-sectional view of a packaging chip according to an exemplary embodiment of the present invention. Referring to FIG. 1, the packaging chip includes a packaging wafer 110, a cavity 120, a metal layer 130, a under bump metallurgy layer (UBM) layer 140, a base wafer 150, a bonding layer 155, a circuit module 160, a bump 165, a seed layer 180, a connecting electrode 190, and an electrode 195.

The packaging wafer 110 packages the circuit module 160. In general, a silicon wafer may be used as the packaging wafer 110.

The base wafer 150 is a portion on which the base wafer 150 is mounted. The circuit module 160 may be a general radio frequency (RF) circuit module, an image sensor module, or other circuit known in the art. As shown in FIG. 1, the circuit module 160 is formed on an upper surface of the base wafer 150. However, if the base wafer 150 is a printed circuit board (PCB), the circuit module 160 may be embedded in the base wafer 150.

The cavity 120 is formed in a lower surface of the packaging wafer 110. Thus, the packaging wafer 110 is combined with the base wafer 150 so that the lower surface of the packaging wafer 110 in which the cavity 120 is formed faces an upper surface of the base wafer 150 so as to position the circuit module 160 inside the cavity 120. The bonding layer 155 is stacked on the upper surface of the base wafer 150 to bond the packaging wafer 110 with the base wafer 150.

At least one connecting electrode 190 is formed on the packaging wafer 110. The at least one connecting electrode 190 is formed of a conductive material such as a metal known in the art. The seed layer 180 used for forming the at least one connecting electrode 190 is positioned between the at least one connecting electrode 190 and the packaging wafer 110. This prevents cracks from occurring between the at least one connecting electrode 190 and the packaging wafer 110.

The at least one connecting electrode 190 penetrates upper and lower portions of the packaging wafer 110. If the at least one connecting electrode 190 is formed so as to penetrate an area of the packaging wafer 110 in which the cavity 120 is formed as shown in FIG. 1, an area an entire packaging chip occupies can be reduced. The packaging wafer 110 may be etched to a thickness using polishing so as to form the at least one connecting electrode 190. The thickness may be predetermined. This will be described in detail through a packaging process that will be described later.

The electrode 195 is formed on an upper surface of the packaging wafer 110 so as to be connected to the at least one connecting electrode 190. Also, the metal layer 130 and the UBM layer 140 connected to the at least one connecting electrode 190 are stacked on a lower surface of the packaging wafer 110.

The UBM layer 140 is a metal layer formed between the metal layer 130 and the bump 165 so as to easily perform bonding. The UBM layer 140 is combined with the bump 165 bumped on the circuit module 160 to electrically connect the circuit module 160 to the metal layer 130. Thus, an electric signal supplied from an external power source is transmitted through the electrode 195, the at least one connecting electrode 190, the seed layer 180, the metal layer 130, the UBM layer 140, and the bump 165 to the circuit module 160.

Portions of the metal layer 130 and the UBM layer 140 may be patterned to form an insulating area 135 so as to insulate the metal layer 130 and the UBM layer 140 from portions of the metal layer 130 and the UBM layer 140 exposed outside the packaging chip. The portions for patterning may be predetermined. The UBM layer 140 positioned at an edge of the packaging chip based on the insulating area 135 is bonded to the bonding layer 155. The packaging wafer 110 is combined with the base wafer 150 due to the bonding of the UBM layer 140 to the bonding layer 155. The bonding layer 155 is formed of a bonding material such as epoxy, or other bonding material known in the art.

Figure 2A:
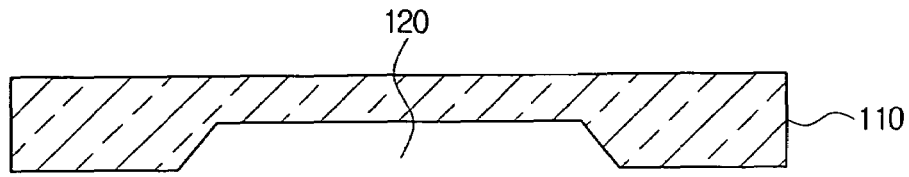
FIGS. 2A through 2G are cross-sectional views illustrating a method of packaging the packaging chip shown in FIG. 1.

FIGS. 2A through 2G are cross-sectional views illustrating a process of packaging a circuit module to manufacture the packaging chip shown in FIG. 1. As shown in FIG. 2A, an area of the lower surface of the packaging wafer 110 is etched to form the cavity 120. The area may be predetermined.

Figure 2B:
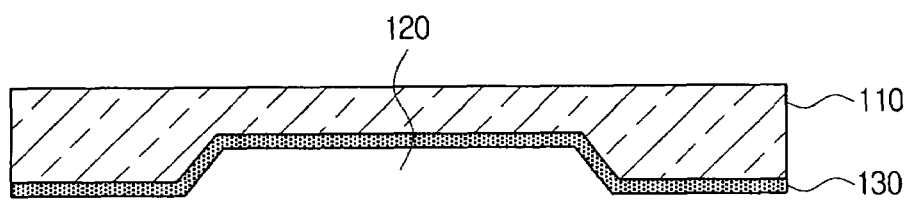
Figure 2C:
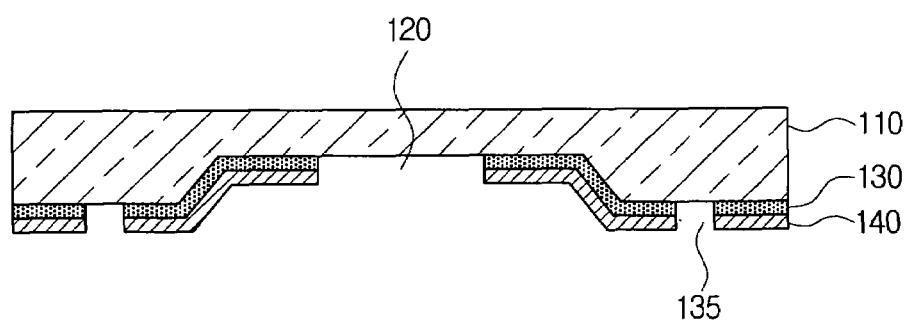

As shown in FIG. 2B, the metal layer 130 is stacked on the entire lower surface of the packaging wafer 110. As shown in FIG. 2C, the UBM layer 140 is stacked on a surface of the metal layer 130, and then the metal layer 130 and the UBM layer 140 are patterned in shapes. The patterned shapes may be predetermined. Thus, the insulating area 135 may be formed, and portions of the metal layer 130 and the UBM layer 140 stacked inside the cavity 120 may be removed to increase a depth of the cavity 120.

Figure 2D:
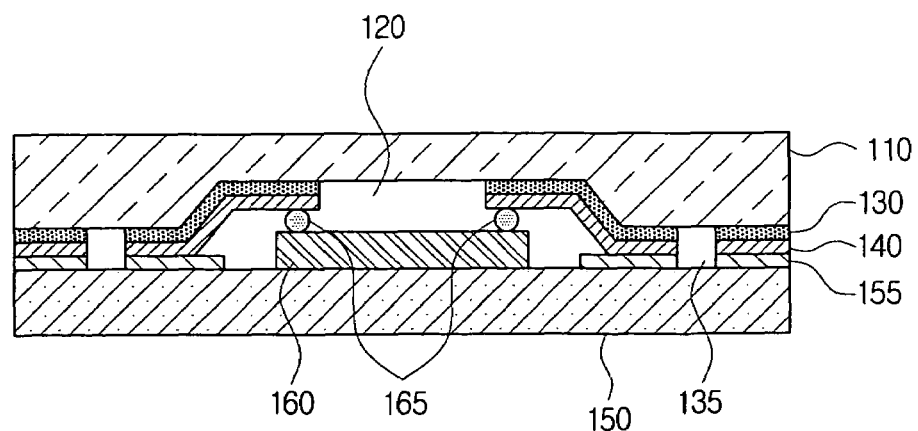

As shown in FIG. 2D, the packaging wafer 110 is combined with the base wafer 150. For this purpose, the bonding layer 155 is stacked in a position of the upper surface of the base wafer 150 opposite to the UBM layer 140. Also, the circuit module 160 is mounted on the base wafer 150 in advance. Thus, the bump 165 is formed on the circuit module 160 using a bumping method to connect the circuit module 160 to the UBM layer 140. If the base wafer 150 is a PCB as described above, the base wafer 150 may include the circuit module 160. If the base wafer 150 includes the circuit module 160, a process of stacking the UBM layer 140 may be omitted.

Figure 2E:
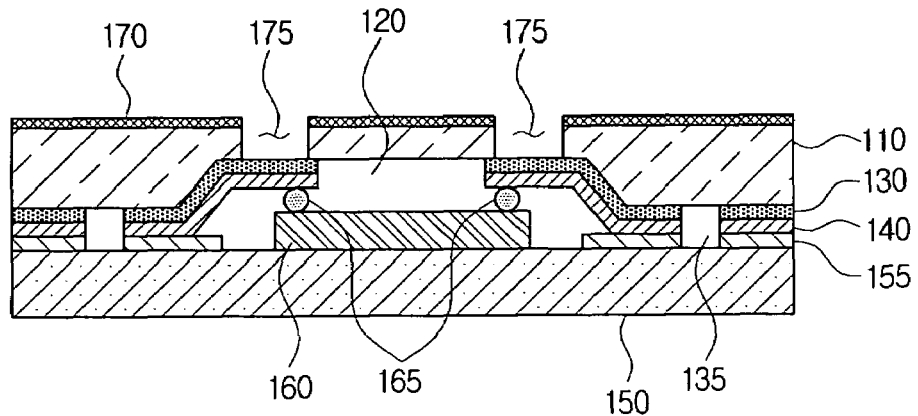

As shown in FIG. 2E, the upper surface of the packaging wafer 110, i.e., a surface of the packaging wafer 110 opposite to a surface of the packaging wafer 110 that was combined with the base wafer 150, is polished to reduce a thickness of the packaging wafer 110. In detail, in the case of the packaging wafer 110 having a thickness of about 300±3 μm, the packaging wafer 110 is polished to a thickness of about 120±10 μm using lapping and polishing processes. Since the packaging wafer 110 is combined with the base wafer 150 and then polished, a possibility of the packaging wafer 110 being damaged during the polishing process is remarkably reduced.

At least one or more viaholes 175 are formed using a photo resist 170. The viaholes 175 may be formed through a reactive ion etching (RIE) process, or other etching process known in the art. The viaholes 175 penetrate the packaging wafer 110 to expose the metal layer 130 underneath the packaging wafer 110. In this case, a number of viaholes 175 may be set depending on a number of terminals (not shown) of the circuit module 160 to be packaged. The number may be arbitrarily set. The viaholes 175 may penetrate an inside of the cavity 120 so as to reduce a size of the package chip.

Figure 2F:
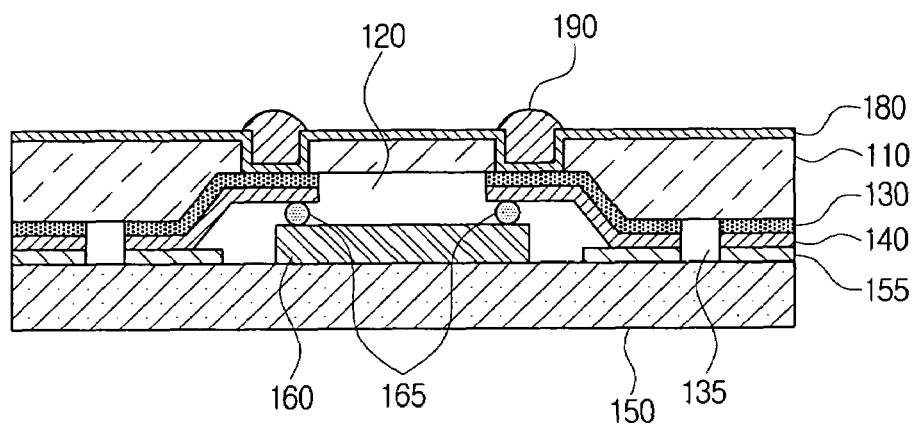

As shown in FIG. 2F, the seed layer 180 is stacked on the entire upper surface of the packaging wafer 110. The seed layer 180 may be deposited of chrome, silver, or other metallic substance known in the art, using a thermal evaporator.

The seed layer 180 is stacked even on a portion of the metal layer 130 exposed inside the viaholes 175 and inner sides of the viaholes 175. The insides of the viaholes 175 are plated using the seed layer 180 to form the connecting electrode 190. In this case, the packaging wafer 110 is polished to have a very thin thickness as shown in FIG. 2E, and thus depths of the viaholes 175 become shallow. Thus, although the seed layer 180 is stacked even on the sides of the viaholes 175, a plating speed does not greatly vary. Thus, voids can be prevented from occurring during the plating process. Also, the connecting electrode 190 can be prevented from being separated from the packaging wafer 110.

Figure 2G:
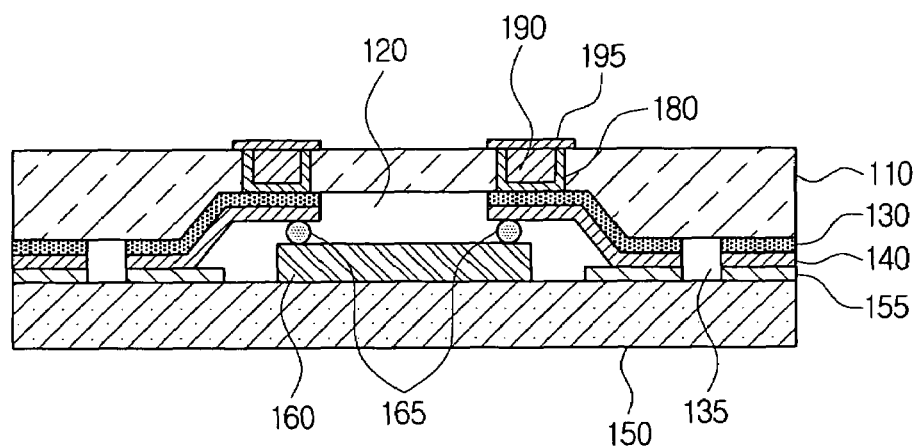

As shown in FIG. 2G, the upper surface of the packaging wafer 110 is polished to remove the seed layer 180 stacked thereon. In this case, a portion of the connecting electrode 190 protruding from the upper surface of the packaging wafer 110 is also polished and planarized during the plating process.

The electrode 195 connected to the connecting electrode 190 is formed. The electrode 195 is formed by stacking and patterning a metal material on the upper surface of the packaging wafer 110.

Figure 3:
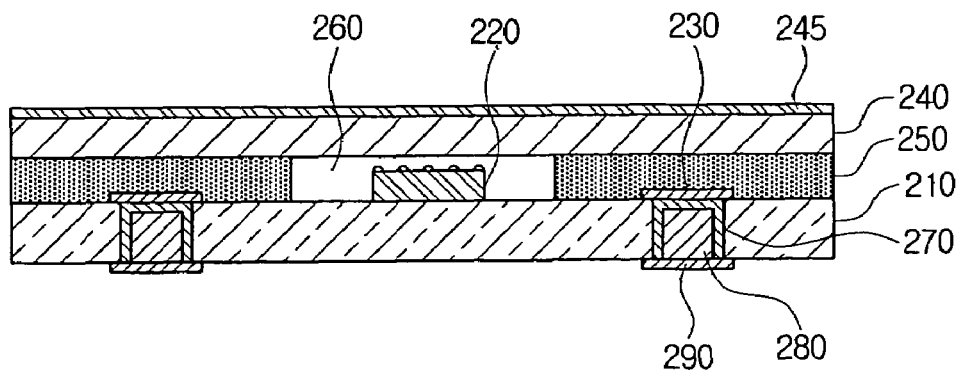
FIG. 3 is a cross-sectional view of a packaging chip according to another exemplary embodiment of the present invention.

FIG. 3 is a cross-sectional view of a packaging chip in which an image sensor is packaged according to another exemplary embodiment of the present invention. Referring to FIG. 3, the packaging chip includes a packaging wafer 210, an image sensor 220, a metal layer 230, a glass wafer 240, a coating layer 245, a bonding layer 250, a cavity 260, a seed layer 270, a connecting electrode 280, and an electrode 290. Describing the configuration of the packaging chip shown in FIG. 3, the packaging wafer 210 and the glass wafer 240 are respectively positioned in opposite directions to directions shown in FIG. 1. This is only an example but may be positioned as shown in FIG. 1.

The image sensor 220 may be a complementary metal oxide semiconductor image sensor (CIS). The CIS attracts attention as a solution replacing an existing charge coupled device (CCD) in a next generation portable communication device, a video conference camera, a digital camera, or the like. Thus, the packaging chip shown in FIG. 3 may be installed in a cellular phone, a personal digital assistant (PDA), a notebook PC, or the like to photograph an image.

The image sensor 220 is formed on a surface (hereinafter referred to as an upper surface) of the packaging wafer 210 so as to be positioned inside the cavity 260 formed between the packaging wafer 210 and the glass wafer 240

When the bonding layer 250 stacked on a lower surface of the glass wafer 240 is bonded to the metal layer 230 stacked on the upper surface of the packaging wafer 210, the cavity 260 having a size corresponding to a height of the bonding layer 250 is formed between the packaging wafer 210 and the glass wafer 240.

At least one connecting electrode 280 is formed in the packaging wafer 210. The seed layer 270 is positioned between the connecting electrode 280 and the packaging wafer 210. The electrode 290 connected to the connecting electrode 280 is formed on an other surface (hereinafter referred to as a lower surface) of the packaging wafer 210.

The coating layer 245 is formed on an upper surface of the glass wafer 240. The coating layer 245 protects the glass wafer 240.

Figure 4A:
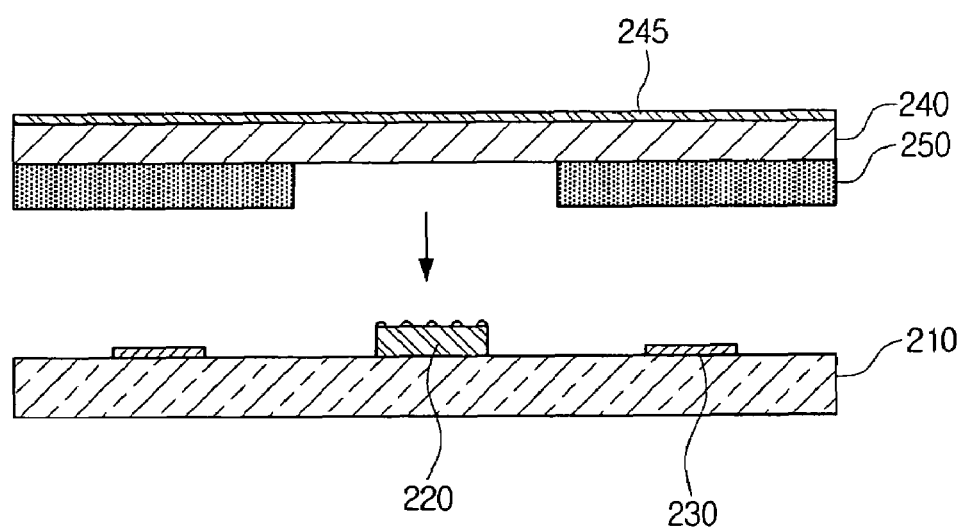
FIGS. 4A through 4E are cross-sectional views illustrating a method of packaging the packaging chip shown in FIG. 3.

FIGS. 4A through 4E are cross-sectional views illustrating a process of packaging the image sensor 220 to manufacture the packaging chip shown in FIG. 3. As shown in FIG. 4A, the glass wafer 240 including a surface on which the bonding layer 250 is stacked in a pattern. The pattern may be predetermined. The packaging wafer 210 including a surface on which the image sensor 220 and the metal layer 230 are formed are separately provided. In this case, the coating layer 245 may be formed on an other surface of the glass wafer 240.

Figure 4B:
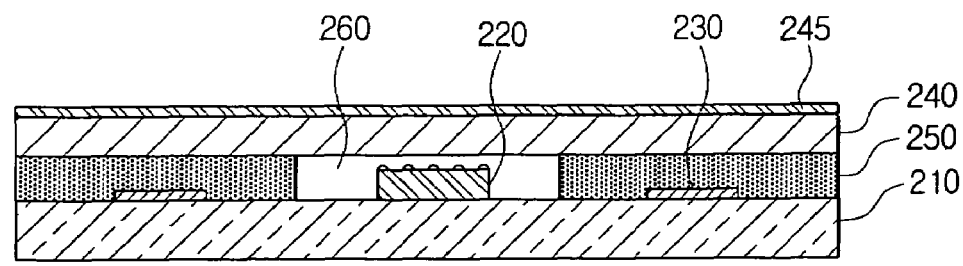

As shown in FIG. 4B, the metal layer 230 on the packaging wafer 210 is bonded to the bonding layer 250 on the glass wafer 240 so as to combine the packaging wafer 210 with the glass wafer 240. In this case, the cavity 260 having a size corresponding to heights of the bonding layer 250 and the metal layer 230 is formed in a space in which the bonding layer 250 and the metal layer 230 do not exist. Thus, the image sensor 220 is positioned inside the cavity 260.

Figure 4C:
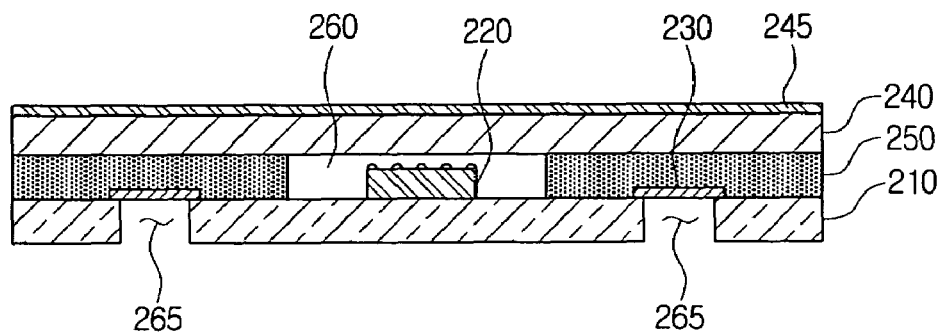

As shown in FIG. 4C, the lower surface of the packaging wafer 210 is polished so as to reduce a thickness of the packaging wafer 210. At least one viahole 265 is formed so as to penetrate the packaging wafer 210 and be connected to the metal layer 230.

Figure 4D:
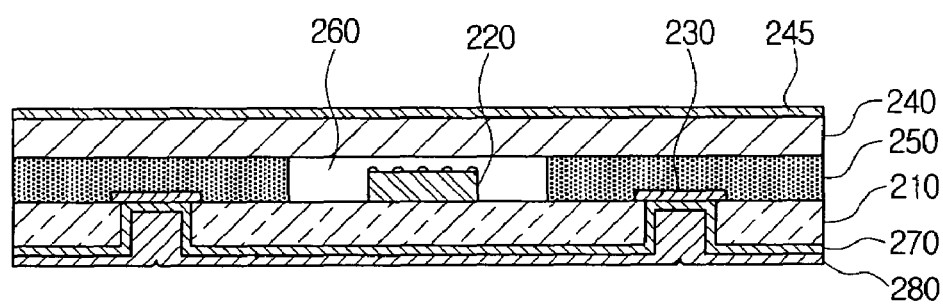

As shown in FIG. 4D, the seed layer 270 is stacked on the entire lower surface of the packaging wafer 210 and then plated so as to form the connecting electrode 280.

Figure 4E:
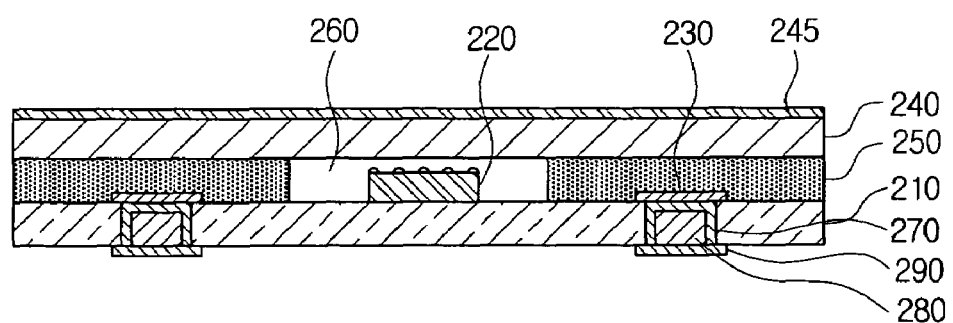

As shown in FIG. 4E, the entire lower surface of the packaging wafer 210 is polished to remove a portion of the connecting electrode 280 and the seed layer 270. The electrode 290 connected to the connecting electrode 280 filling an inside of the viahole 265 is formed.

Figure 5:
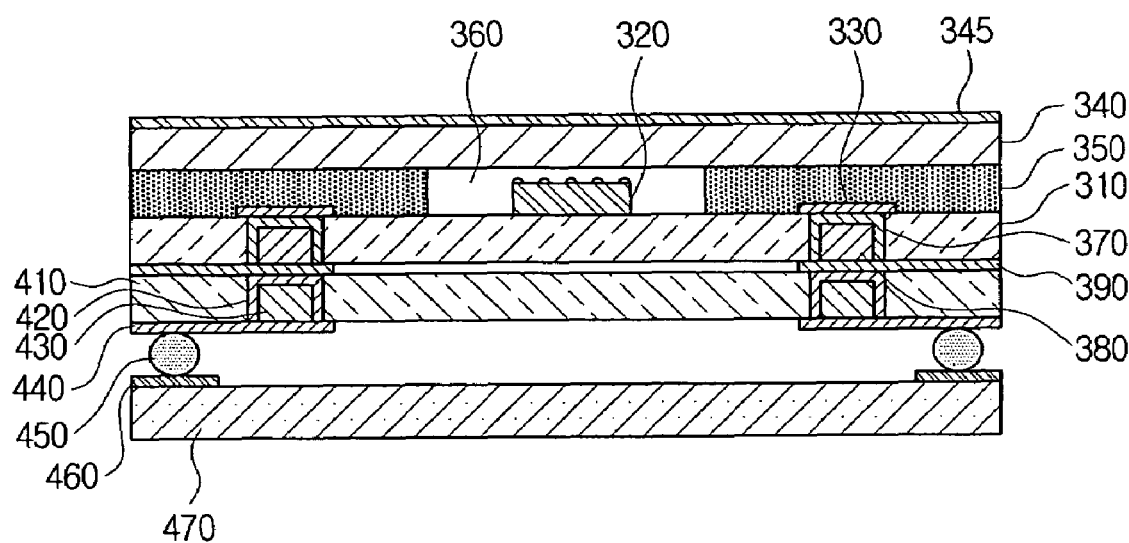
FIG. 5 is a cross-sectional view of a packaging chip according to still another exemplary embodiment of the present invention.

FIG. 5 is a cross-sectional view of a packaging chip according to still another exemplary embodiment of the present invention. Referring to FIG. 5, the packaging chip includes a packaging wafer 310, an image sensor 320, a metal layer 330, a glass wafer 340, a coating layer 345, a bonding layer 350, a cavity 360, a first seed layer 370, a first connecting electrode 380, a first electrode 390, a first substrate 410, a second seed layer 420, a second connecting electrode 430, a second electrode 440, a bump 450, a pad 460, and a second substrate 470.

As shown in FIG. 5, the packaging wafer 310, the image sensor 320, the metal layer 330, the glass wafer 340, the coating layer 345, the bonding layer 350, the cavity 360, the first seed layer 370, the first connecting electrode 380, and the first electrode 390 have the same structures as those of the packaging chip shown in FIG. 3. However, the packaging chip according to this exemplary embodiment additionally includes the first substrate 410, the second seed layer 420, the second connecting electrode 430, the second electrode 440, the bump 450, the pad 460, and the second substrate 470. A circuit module (not shown) processing data photographed by the image sensor 220 is installed in the first substrate 410. The circuit module may be predetermined. The circuit module is installed in the first substrate 410 as shown in FIG. 5 but may be installed on an upper surface of the first substrate 410.

The first substrate 410 may be manufactured using the same method as that described with reference to FIGS. 4A through 4E. In other words, the first substrate 410 including the circuit module is bonded to a lower surface of the packaging wafer 310. A viahole connected to the first electrode 390 is formed, and the seed layer 420 is stacked and plated to form the second connecting electrode 430. A lower surface of the first substrate 410 is polished to remove the second seed layer 420 and a protruding portion of the second connecting electrode 430, and then the second electrode 440 is formed. The number of the first substrate 410 is one as shown in FIG. 5. However, a plurality of substrates respectively including circuit modules may be sequentially stacked on the lower surface of the packaging wafer 310.

The first substrate 410 may be bonded to the second substrate 470 using the bump 450 and the pad 460. The second substrate 470 may be a mother board.

As described above, according to the present invention, voids or cracks can be prevented from occurring inside a packaging wafer during packaging of a circuit module. Also, a plating speed can be improved to reduce packaging time and cost.

The foregoing embodiments and advantages are merely exemplary and are not to be construed as limiting the present invention. The present teaching can be readily applied to other types of apparatuses. Also, the description of exemplary embodiments of the present invention is intended to be illustrative, and not to limit the scope of the claims, and many alternatives, modifications, and variations will be apparent to those skilled in the art.

What is claimed is:

1. A packaging chip comprising:
   a base wafer;
   a circuit module formed in an area of an upper surface of the base wafer;
   a packaging wafer having a lower surface comprising an area comprising a cavity, wherein the packaging wafer is combined with the base wafer so that the circuit module is positioned inside the cavity;
   a connecting electrode connecting upper and lower surfaces of the area of the packaging wafer in which the cavity is formed;
   a seed layer positioned between the connecting electrode and the packaging wafer;
   an under bump metallurgy (UBM) layer in an area of the lower surface of the packaging wafer; and
   a bump connecting the UBM layer to the circuit module.

2. The packaging chip of claim 1, wherein the circuit module is disposed on the upper surface of the base wafer.

3. A packaging chip comprising:
   a base wafer;
   a circuit module formed in an area of an upper surface of the base wafer;
   a packaging wafer having a lower surface comprising an area comprising a cavity, wherein the packaging wafer is combined with the base wafer so that the circuit module is positioned inside the cavity;
   a connecting electrode connecting upper and lower surfaces of the area of the packaging wafer in which the cavity is formed;
   a seed layer positioned between the connecting electrode and the packaging wafer;
   a metal layer stacked in an area of the lower surface of the packaging wafer;
   an under bump metallurgy (UBM) layer stacked in an area of the metal layer;
   a bonding layer stacked in an area of an upper surface of the base wafer to be bonded to the UBM layer so as to combine the packaging wafer with the base wafer; and
   a bump connecting the UBM layer to the circuit module.

4. A method of packaging a circuit module formed on a base wafer using a packaging wafer, the method comprising:
   etching a lower surface of the packaging wafer to form a cavity and stacking a metal layer in an area of the lower surface of the packaging wafer;
   combining the base wafer comprising an upper surface comprising an area in which the circuit module is formed with the packaging wafer;
   polishing the upper surface of the packaging wafer;
   forming at least one viahole penetrating the packaging wafer so as to be connected to the metal layer;
   stacking a seed layer on a portion of the metal layer which is exposed to the upper surface of the packaging wafer through the at least one viahole, an inner side of the at least one viahole, and the upper surface of the packaging wafer;
   plating an inside of the at least one viahole using the seed layer to form at least one connecting electrode; and
   removing the seed layer stacked on the upper surface of the packaging wafer and forming an electrode connected to the at least one connecting electrode.

5. The method of claim 4, wherein the at least one viahole is formed inside the cavity.

6. The method of claim 5, wherein the combining of the base wafer comprises:
- stacking and patterning an under bump metallurgy (UBM) layer on the metal layer which is stacked on the lower surface of the packaging wafer;
- stacking a bonding layer in an area of the upper surface of the base wafer; and
- bonding the UBM layer to the bonding layer.

7. A packaging chip comprising:
- a glass wafer;
- a bonding layer stacked in an area of a lower surface of the glass wafer;
- a packaging wafer having an upper surface comprising an area in which a metal layer is stacked and combined with the base wafer due to bonding of the metal layer to the bonding layer;
- an image sensor module formed in an area of the upper surface of the packaging wafer and positioned inside a cavity formed between the lower surface of the glass wafer and the upper surface of the packaging wafer;
- at least one connecting electrode connecting the metal layer stacked on the upper surface of the packaging wafer to a lower surface of the packaging wafer; and
- a seed layer positioned between the at least one connecting electrode and the packaging wafer.

8. The packaging chip of claim 7, further comprising:
- a coating layer formed on an upper surface of the glass wafer; and
- an electrode formed on the lower surface of the packaging wafer so as to be connected to the at least one connecting electrode.

9. The packaging chip of claim 8, further comprising at least one substrate which is sequentially stacked on the lower surface of the packaging wafer and on which a circuit module is mounted.

10. A method of packaging an image sensor, the method comprising:
- stacking a bonding layer in an area on a lower surface of a glass wafer;
- mounting an image sensor module on an upper surface of a packaging wafer;
- stacking a metal layer in an area of the upper surface of the packaging wafer;
- bonding the metal layer to the bonding layer to combine the packaging wafer with the glass wafer so that the image sensor module is positioned inside a cavity which is formed between the lower surface of the glass wafer and the upper surface of the packaging wafer;
- polishing a lower surface of the packaging wafer;
- forming at least one viahole penetrating the packaging wafer to be connected to the metal layer;
- stacking a seed layer on a portion of the metal layer which is exposed toward the lower surface of the packaging wafer through the at least one viahole, an inner side of the at least one viahole, and the lower surface of the packaging wafer; and
- plating an inside of the at least one viahole using the seed layer to form at least one connecting electrode.

11. The method of claim 10, further comprising removing the seed layer stacked on the lower surface of the packaging wafer and forming an electrode connected to the at least one connecting electrode.

12. The method of claim 11, further comprising forming a coating layer on an upper surface of the glass wafer.

13. The method of claim 11, further comprising sequentially stacking at least one substrate on which a circuit module is mounted, on the lower surface of the packaging wafer.

* * * * *